United States Patent
Yamada et al.

(10) Patent No.: US 7,847,280 B2
(45) Date of Patent: *Dec. 7, 2010

(54) NONPOLAR III-NITRIDE LIGHT EMITTING DIODES WITH LONG WAVELENGTH EMISSION

(75) Inventors: Hisashi Yamada, Tsukuba (JP); Kenji Iso, Fujisawa (JP); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/189,038

(22) Filed: Aug. 8, 2008

(65) Prior Publication Data

US 2009/0039339 A1    Feb. 12, 2009

Related U.S. Application Data

(60) Provisional application No. 60/954,770, filed on Aug. 8, 2007.

(51) Int. Cl.
*H01L 31/00* (2006.01)
(52) U.S. Cl. .............. 257/14; 257/E33.033; 438/27
(58) Field of Classification Search ............... 257/13, 257/94, 99, 103, 9, 14, E33.018, E33.033; 438/22, 26, 27
See application file for complete search history.

(56) References Cited

U.S. PATENT DOCUMENTS

| 6,288,416 | B1 | 9/2001 | Koike et al. | |
|---|---|---|---|---|
| 6,316,785 | B1 | 11/2001 | Nunoue et al. | |
| 6,372,980 | B1 | 4/2002 | Freundlich | |
| 6,891,187 | B2 * | 5/2005 | Cho et al. | 257/15 |
| 7,186,302 | B2 | 3/2007 | Chakraborty et al. | |
| 2002/0144645 | A1 | 10/2002 | Kim et al. | |
| 2003/0024475 | A1 | 2/2003 | Anderson | |
| 2005/0142391 | A1 | 6/2005 | Dmitriev et al. | |
| 2005/0161697 | A1 | 7/2005 | Nakahata et al. | |
| 2005/0214992 | A1 * | 9/2005 | Chakraborty et al. | 438/172 |
| 2005/0224781 | A1 * | 10/2005 | Kneissl et al. | 257/14 |
| 2005/0258451 | A1 | 11/2005 | Saxler et al. | |
| 2006/0049415 | A1 * | 3/2006 | Liao et al. | 257/94 |
| 2007/0138461 | A1 * | 6/2007 | Sundaram et al. | 257/21 |

OTHER PUBLICATIONS

Jeon et al., "Recombination dynamics in InGaN quantum wells", 1996, Appl. Phys. Lett., vol. 69, No. 27, pp. 4194-4196.*
Shao, Y-P. et al., "Electrical Characterization of Semipolar Gallium Nitride Thin Films," NNIN REU Research Accomplishments, Aug. 2005, pp. 132-133.
International Search Report mailed Oct. 24, 2008, International application No. PCT/US2008/072682, International filing date Aug. 8, 2008.

* cited by examiner

*Primary Examiner*—Thomas L Dickey
*Assistant Examiner*—Nikolay Yushin
(74) *Attorney, Agent, or Firm*—Gates & Cooper LLP

(57) ABSTRACT

A III-nitride film, grown on an m-plane substrate, includes multiple quantum wells (MQWs) with a barrier thickness of 27.5 nm or greater and a well thickness of 8 nm or greater. An emission wavelength can be controlled by selecting the barrier thickness of the MQWs. Device fabricated using the III-nitride film include nonpolar III-nitride light emitting diodes (LEDs) with a long wavelength emission.

27 Claims, 4 Drawing Sheets

NONPOLAR III-NITRIDE LIGHT EMITTING DIODES WITH LONG WAVELENGTH EMISSION

CROSS REFERENCE TO RELATED APPLICATIONS

This application claims the benefit under 35 U.S.C. Section 119(e) of U.S. Provisional Patent Application Ser. No. 60/954,770, filed on Aug. 8, 2007, by Hisashi Yamada, Kenji Iso, and Shuji Nakamura, entitled "NONPOLAR III-NITRIDE LIGHT EMITTING DIODES WITH LONG WAVELENGTH EMISSION", which application is incorporated by reference herein.

This application is related to the following co-pending and commonly-assigned U.S. patent applications:

U.S. utility application Ser. No. 12/140,096, filed on Jun. 16, 2008, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR M-PLANE GROUP III NITRIDE FILMS GROWN ON MISCUT SUBSTRATES," which application claims the benefit of U.S. Provisional Application Ser. No. 60/944,206, filed on Jun. 15, 2007, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR M-PLANE GROUP III NITRIDE FILMS GROWN ON MISCUT SUBSTRATES;" and U.S. Utility application Ser. No. 12/189,026, filed on same date herewith, by Kenji Iso, Hisashi Yamada, Makoto Saito, Asako Hirai, Steven P. DenBaars, James S. Speck, and Shuji Nakamura, entitled "PLANAR NONPOLAR M-PLANE GROUP III-NITRIDE FILMS GROWN ON MISCUT SUBSTRATES," which application claims the benefit of U.S. Provisional Application Ser. No. 60/954,744 filed on Aug. 8, 2007 by Kenji Iso, Hisashi Yamada, Makoto Saito, Asako Hirai, Steven P. DenBaars, James S. Speck, and Shuji Nakamura, entitled "PLANAR NONPOLAR M-PLANE GROUP III-NITRIDE FILMS GROWN ON MISCUT SUBSTRATES," and U.S. Provisional Application Ser. No. 60/954,767 filed on Aug. 8, 2007, by Hisashi Yamada, Kenji Iso, Makoto Saito, Asako Hirai, Steven P. DenBaars, James S. Speck, and Shuji Nakamura, entitled "III-NITRIDE FILMS GROWN ON MISCUT SUBSTRATES;"

all of which applications are incorporated by reference herein.

BACKGROUND OF THE INVENTION

1. Field of the Invention

This invention relates to InGaN/GaN light emitting diodes (LEDs) and laser diodes (LDs), and more particularly to nonpolar III-nitride LEDs in which the wavelength can be controlled by selecting the barrier thickness of multiple quantum wells (MQWs).

2. Description of the Related Art

The usefulness of gallium nitride (GaN) and its ternary and quaternary compounds incorporating aluminum and indium (AlGaN, InGaN, AlInGaN) has been well established for fabrication of visible and ultraviolet optoelectronic devices and high-power electronic devices. These compounds are referred to herein as Group III nitrides, or III-nitrides, or just nitrides, or by the nomenclature (Al, B, Ga, In)N. Devices made from these compounds are typically grown epitaxially using growth techniques including molecular beam epitaxy (MBE), metalorganic chemical vapor deposition (MOCVD), and hydride vapor phase epitaxy (HVPE).

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in Group-III nitride optoelectronic devices is to grow the devices on nonpolar planes of the crystal. For example, in GaN crystals, such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {10-10} family, known collectively as m-planes.

The other cause of polarization is piezoelectric polarization. This occurs when the material experiences a compressive or tensile strain, as can occur when (Al, B, Ga, In)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction than that of the spontaneous polarization of the InGaN and GaN. For an AlGaN layer lattice matched to GaN, the piezoelectric polarization will point in the same direction as that of the spontaneous polarization of the AlGaN and GaN.

The advantage of using nonpolar planes over c-plane nitrides is that the total polarization will be reduced. There may even be zero polarization for specific alloy compositions on specific planes. Such scenarios will be discussed in detail in future scientific papers. The important point is that the polarization will be reduced compared to that of c-plane nitride structures.

Although high performance optoelectronic devices on nonpolar on-axis m-plane GaN have been demonstrated, it is difficult to obtain long wavelength emission from InGaN/GaN MQWs grown on m-plane GaN. This is probably due to the low In incorporation of the InGaN/GaN MQWs. The emission wavelength of devices grown on m-plane is typically 400 nm, while the emission wavelength of devices grown on c-plane is 450 nm at the same growth condition. Reducing the growth temperature increases the In incorporation; however, crystal quality would be degraded. This would be a significant problem for applications such as blue, green, yellow, and white LEDs.

The present invention describes a technique for the growth of nonpolar III-nitride light emitting devices in which the emission wavelength from the devices can be controlled by the barrier thickness of the MQWs in the devices. For example, the present invention has obtained blue and green emission without the effect of polarization.

SUMMARY OF THE INVENTION

To overcome the limitations in the prior art described above, and to overcome other limitations that will become apparent upon reading and understanding the present specification, the present invention discloses a III-nitride film grown on an m-plane substrate, wherein a barrier thickness of the MQWs in the film is 27.5 nm or greater.

Specifically, the present invention discloses a III-nitride film comprised of one or more indium-containing quantum wells with a barrier thickness of 27.5 nm or greater. The quantum wells may be sandwiched between at least a first barrier and a second barrier, wherein the first barrier and second barrier each have a thickness of 27.5 nm or greater. Moreover, the quantum wells' thickness may be 8 nm or greater.

The quantum wells may be nonpolar. In addition, the quantum wells emit light, having a peak wavelength, in response to a range of injection currents passing through the film; and the quantum wells may have a nonpolar orientation, such that interfaces between the quantum wells and the barrier thickness, and between the quantum wells, are nonpolar planes, wherein the nonpolar planes and an alloy composition of an active layer are selected to reduce a polarization of the film or quantum wells, so that the peak wavelength remains significantly constant for a range of injection currents, thereby defining a degree of nonpolarity of the quantum wells or the film. The range of injection currents may produce a range of intensities for the emitted light, wherein a maximum intensity is at least 37 times a minimum intensity.

The quantum wells may comprise two or more quantum wells, namely MQWs. The film may be grown on m-plane GaN. The quantum wells may be InGaN quantum wells and the barrier may be a GaN barrier.

The barrier thickness may be selected to obtain light emission from the quantum wells with a peak wavelength longer than 475 nm, and the light emission may result from electron-hole pair recombination between an electron in a quantum well state in a conduction band of the III-nitride film and a hole in quantum well state in a valence band of the III-nitride film. Increasing the barrier thickness increases an emission wavelength.

In addition, the present invention discloses a device fabricated using the III-nitride film as described above. For example, the film may be an active layer of a light emitting device.

Finally, the present invention discloses a method of emitting light from a III-nitride film, comprising emitting the light from one or more indium-containing quantum wells with a barrier thickness of 27.5 nm or greater, and a method of fabricating a Group-III nitride film, comprising growing one or more indium-containing quantum wells with a barrier thickness of 27.5 nm or greater.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a Group-III nitride film grown on an m-plane substrate in which the emission wavelengths from the film can be controlled by selecting a barrier thickness of the MQWs in the film.

Current nitride devices are typically grown in the polar [0001] c-direction, which results in charge separation along the primary conduction direction in vertical devices. The resulting polarization fields are detrimental to the performance of current state of the art optoelectronic devices.

Growth of these devices along a nonpolar direction has improved device performance significantly by reducing built-in electric fields along the conduction direction. However, the emission wavelength of the LEDs grown on on-axis m-plane is typically 400 nm, which is limited to applications for optical devices.

The novel feature of this invention is that III-nitride films emitting long wavelengths can be grown using thick barrier MQWs. As evidence of this, the present invention has grown InGaN/GaN-based LEDs on m-plane substrates with various barrier thicknesses. The emission wavelength of the film grown with a barrier thickness of 12.5 nm was 439 nm, while the emission wavelength of the film grown with a barrier thickness of 27.5 nm or greater was 480 nm.

Technical Description

The present invention comprises III-nitride films with a long emission wavelength utilizing a thick barrier of the MQWs in the growth process. In one embodiment, the barrier thickness is 27.5 nm or greater to obtain long wavelength emission from the MQWs.

Figure 1A:
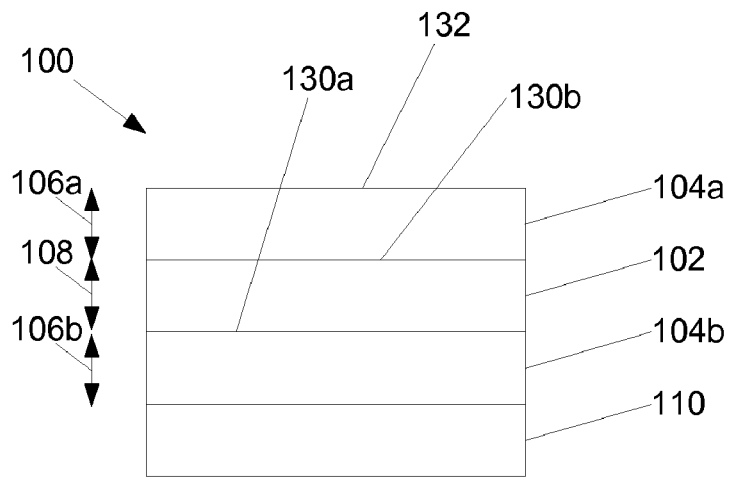
FIG. 1(a) is a cross sectional schematic of the film of the present invention.

FIG. 1(a) illustrates a III-nitride film 100 comprising one or more quantum wells 102 with a barrier layer 104a, 104b thickness 106a, 106b of 27.5 nm or greater. The quantum wells 102 are typically indium containing III-nitride quantum wells. The quantum well 102 is typically sandwiched between a first barrier 104a and a second barrier 104b, wherein the first barrier 104a and second barrier 104b each have the barrier thickness 106a, 106b of 27.5 nm or greater. The film 100 may comprise quantum wells 102, first barrier 104a having thickness 106a, and second barrier 104b having thickness 106b.

The quantum well's 102 thickness 108 may be 8 nm or greater. The film's quantum wells 102 may be nonpolar. The film 100 may comprise two or more quantum wells 102, thereby forming MQW's, wherein each of the quantum wells 102 is clad by barrier layers 104a, 104b (e.g., a MQW may comprise multiple stacked quantum well periods, wherein a quantum well period comprises a quantum well 102 clad by barriers 104a, 104b). A growth substrate for the film 100 may be m-plane GaN 110. The film 100 may comprise further layers, such as an n-type layer between the barrier 104b and the substrate 110, and a p-type layer on the barrier layer 104a, in order to fabricate a device such as an LED. The quantum well 102 may be an InGaN quantum well and the barriers 104a, 104b may be GaN barriers.

Figure 1B:
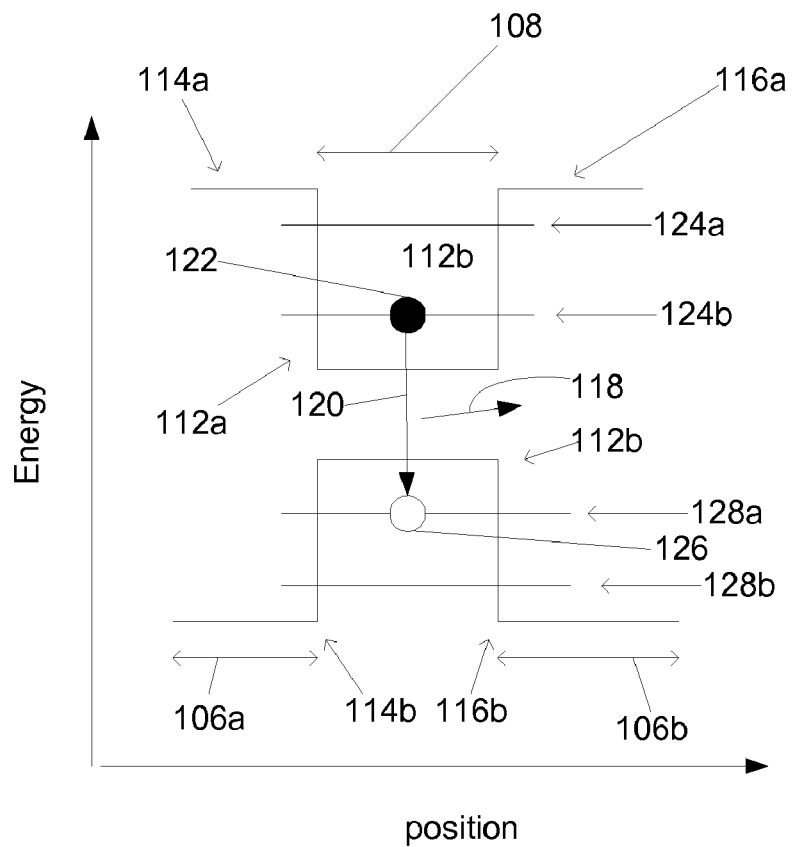
FIG. 1(b) is a band diagram through the layers of the film depicted in FIG. 1(a).

FIG. 1(b) is a schematic of the film's 100 band diagram as a function of position, from top to bottom, through the layers 104a, 102 and 104b, showing the conduction band comprising a quantum well energy 112a of the quantum well 102, a valence band comprising a quantum well energy 112b of the quantum well 102, a conduction band comprising a first barrier energy 114a of the first barrier 104a, a valence band energy comprising a first barrier energy 114b of the first barrier 104a, a conduction band comprising a second barrier energy 116a of the second barrier 104b, and a valence band energy comprising a second barrier energy 116b of the second barrier 104b. The barrier thickness 106a, 106b may be selected to obtain light emission from the quantum wells 102 with a peak wavelength longer than 400 nm or longer than 475 nm, for example.

FIG. 1(b) shows how the light emission 118 may result from electron-hole pair recombination 120 between an electron 122 in a quantum well state such as 124a, 124b in the conduction band of the III-nitride film 100 and a hole 126 in quantum well state such as 128a, 128b in the valence band of the III-nitride film 100.

In the present invention, the LED device structure's epitaxial layers were grown using a conventional MOCVD method on a freestanding m-plane GaN substrate. The LED structure was comprised of a 5 μm-thick Si-doped GaN layer, 6-periods of a GaN/InGaN MQW, a 15 nm-thick undoped $Al_{0.15}Ga_{0.85}N$ layer, and 0.3 μm-thick Mg-doped GaN. The MQW comprised 8 nm thick InGaN wells. The GaN barrier thickness was varied from 12.5 nm to 42.5 nm. After the crystal growth of the LED structure, the samples were annealed for p-type activation and subsequently an n- and p-type metallization process was performed. The p-contact had a diameter of 300 μm and the emission properties were measured at room temperature. The measurement was performed at forward currents between 1 mA and 100 mA (DC), at room temperature.

Experimental Results

Figure 2:
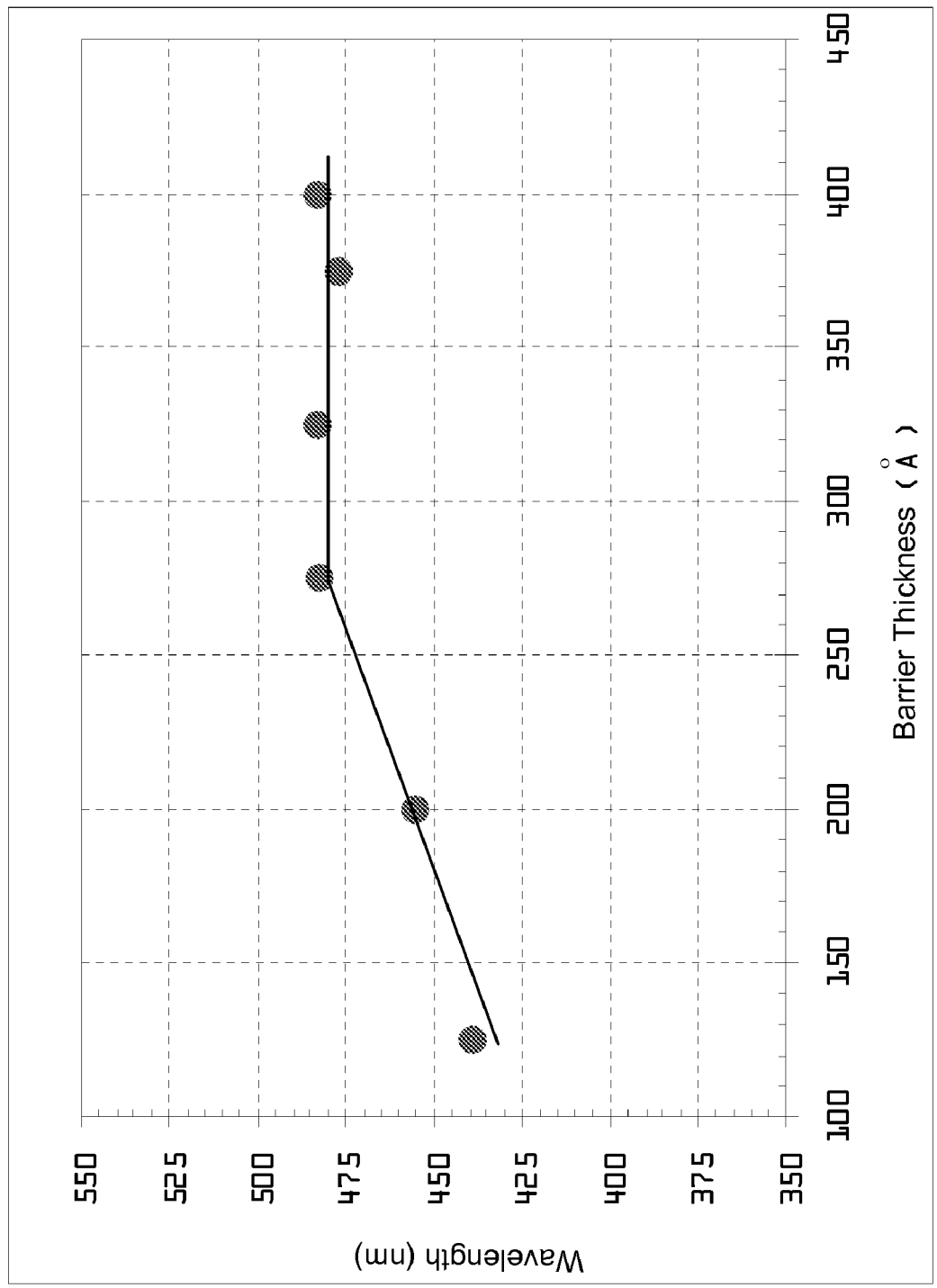
FIG. 2 is a graph plotting wavelength emitted by quantum wells vs. barrier thickness of the quantum wells.

The EL peak wavelength of the LEDs at 20 mA as a function of the barrier thickness is shown in FIG. 2. The measurement was performed at a forward current of 20 mA (DC) at room temperature. The emission wavelength of the LED with a well (barrier) thickness of 8 nm (12.5 nm) has been found to be 439 nm. It was found that the peak wavelength appeared to increase by increasing the barrier thickness from 12.5 nm to 27.5 nm. The peak emission wavelengths of the LEDs with barrier thicknesses of 12.5 nm, 20 nm, and 27.5 nm were 439 nm, 455 nm, and 483 nm, respectively. The peak emission wavelength of the LEDs with a barrier thickness of 27.5 nm or greater was approximately 480 nm. Thus, it is possible to obtain long wavelength emission via thick barrier MQWs, with a barrier thickness of 27.5 nm or greater, on m-plane substrates.

Figure 3:
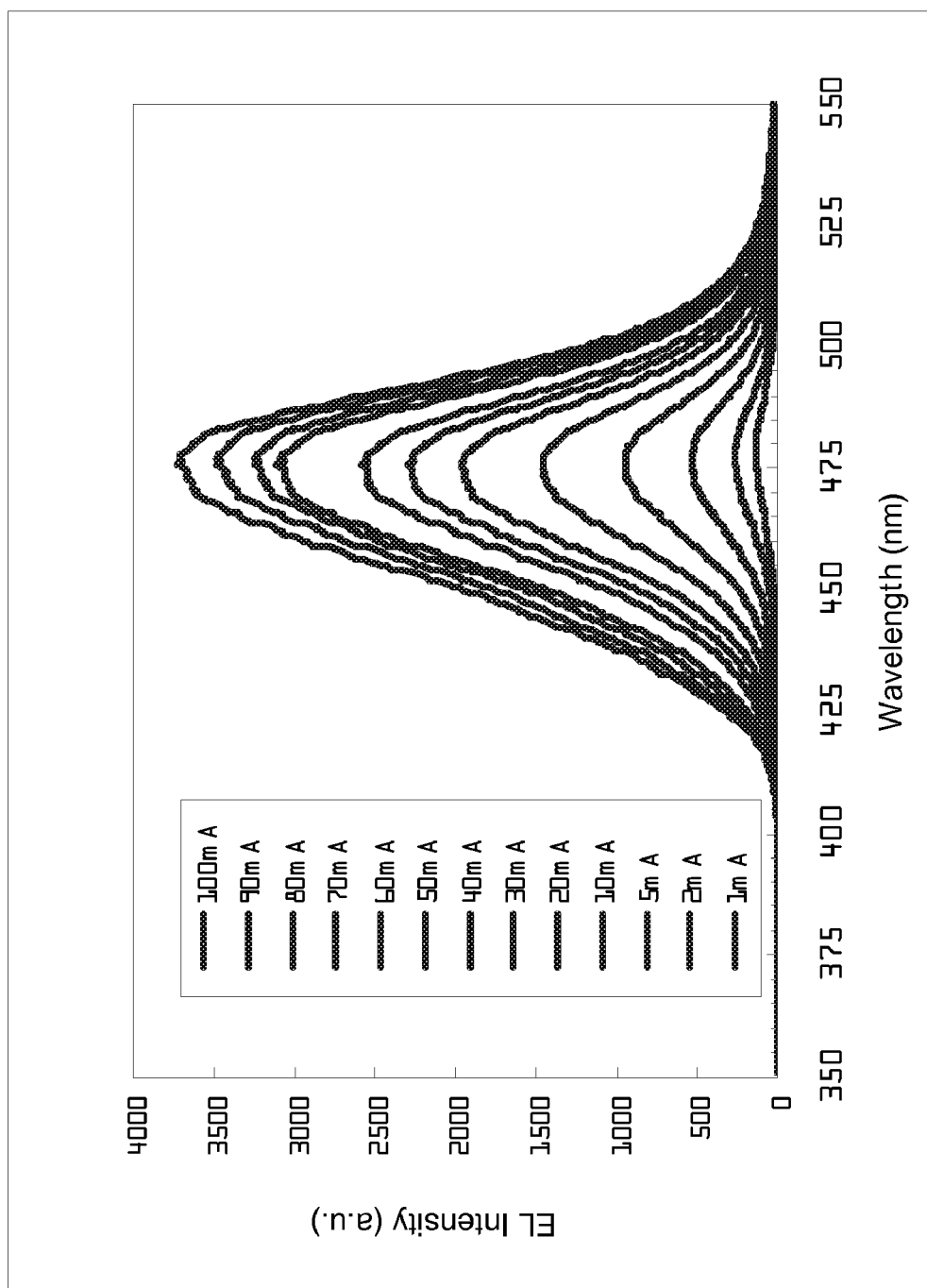
FIG. 3 shows electroluminescence (EL) spectra of the LED with the barrier thickness of 37.5 nm, for different injection currents, wherein the spectra are, from bottom to top, for injection currents of 1 mA, 2 mA, 5 mA, 10 mA, 20 mA, 30 mA, 40 mA, 50 mA, 60 mA, 70 mA, 80 mA, 90 mA and 100 mA.

FIG. 3 shows the EL spectra of the LED with a barrier thickness of 37.5 nm, for various injection currents. It was found that all spectra showed a single peak emission wavelength around 475 nm.

Figure 4:
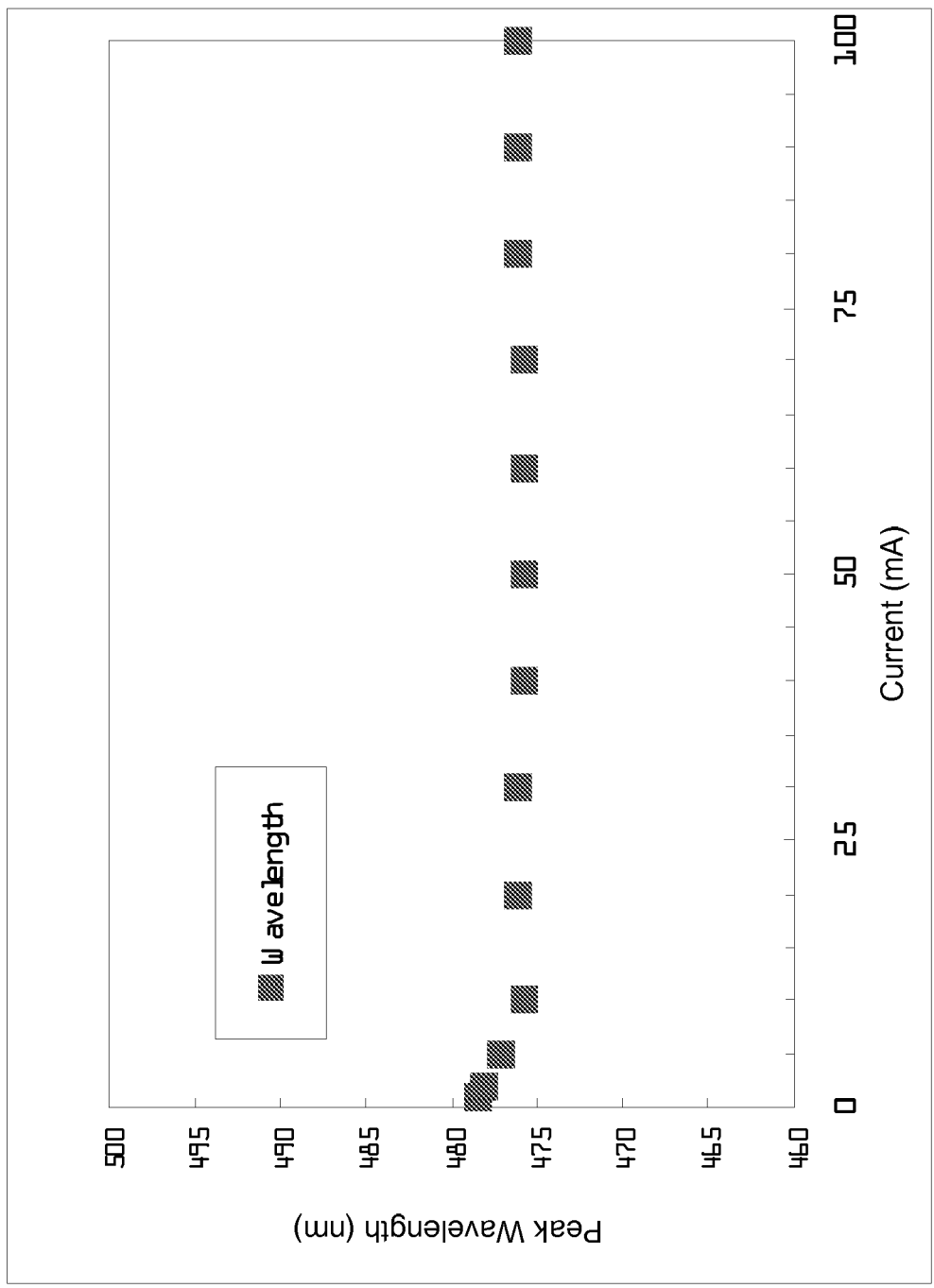
FIG. 4 is a graph of peak emission wavelength from a quantum well vs. current.

The EL intensity and peak wavelength as a function of injection current is shown in FIG. 4. The peak wavelengths at 1 mA and 100 mA were 478.4 nm and 476.1 nm, respectively, indicating that only a 2.3 nm blue shift was observed. This suggests that the polarization is reduced.

FIG. 3 and FIG. 4 also show how the quantum wells 102 may be capable of emitting light 118, having a peak wavelength, in response to a range of injection currents passing through the film 100; and the quantum wells may have a nonpolar orientation such that interfaces 130a, 130b between the quantum wells 102 and the barrier thickness 106a, 106b, and interfaces 132 between quantum well 102 periods, are nonpolar planes, wherein the nonpolar plane(s) and/or an alloy composition of the active layer (e.g. quantum well 102 and/or barriers 104a, 104b) may be selected to reduce the polarization of the film 100 so that the peak wavelength remains significantly constant (for example, but not limited to, within 2.3 nm of the peak wavelength) for a range of injection currents, thereby defining a degree of nonpolarity of the quantum wells 102 or the film 100. The range of currents may produce a range of intensities of the light emitted, wherein the maximum intensity is at least 37 times the minimum intensity, for example (i.e. the maximum current in the range of currents creates a maximum intensity which is at least 37 times the minimum intensity created by the minimum current in the range of currents). However, the range of currents and intensities is not limited to a particular range.

Possible Modifications and Variations

In addition to the m-plane GaN free-standing substrates described above, an a-plane substrate, or miscut substrates of GaN, or other foreign substrates, such as c-Al2O3, r-Al2O3, m-plane SiC, ZnO, and γ-LiAlO2, can be used as a starting material as well. Any substrate suitable for the growth of nonpolar III-nitride compounds may be used.

Although the present invention has been demonstrated using InGaN/GaN films, AlN, InN or any related alloy (e.g., Group-III nitride compounds) can be used as well.

The present invention is not limited to the MOCVD epitaxial growth method described above, but may also use other crystal growth methods, such as HVPE, MBE, etc.

In addition, one skilled in this art would recognize that these techniques, processes, materials, etc., would also apply to an a-plane substrate, miscut substrates in other directions, such as the c-axis direction, c-plane substrate, with similar results.

The present invention is not limited to a particular range of barrier thicknesses 106a, 106b or well thicknesses 108, so long as increasing the barrier thickness 106a, 106b increases the peak wavelength of the light emission 118 from the quantum wells 102 beyond 400 nm. A device may be fabricated using the film 100, for example, the film 100, specifically the quantum wells 102 clad by barriers 104a, 104b, may be an active layer of a light emitting device. The device structure is not limited to a particular light emitting device structure, for example, the device may be an LED and the film 100 may further comprise the active layer between an n-type layer and a p-type layer for powering the active layer, wherein the active layer may be an indium containing III-nitride quantum well 102 sandwiched between two barrier layers 104a, 104b, a thickness 106a, 106b of each of the barrier layers 104a, 104b may be selected to obtain light emission 118 from the quantum wells 102 with a peak wavelength longer than 400 nm or 475 nm, for example. For example, the barrier thickness 106a, 106b may be selected to be 10 nm or greater to achieve the light emission 118 with the peak wavelength greater than 425 nm, wherein increasing the barrier thickness 106a, 106b beyond 10 nm increases the peak wavelength. Thus, increasing the barrier thickness 106a, 106b may increase the emission wavelength. The group III-nitride film 100 may be an active layer of a light emitting device.

Advantages and Improvements

Prior to the present invention, the emission wavelength of InGaN/GaN MQW grown on on-axis m-plane GaN epitaxial layers was limited to approximately 400 nm. By controlling the barrier thickness of the MQWs, long wavelength emission from the structures can be achieved.

For example, blue, green, yellow, and white LEDs without polarization effects would enhance the devices' performance. Moreover, the present invention would enhance the performance of any device.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-nitride film comprising one or more indium-containing quantum wells with a barrier thickness of 27.5 nm or greater, wherein increasing the barrier thickness increases an emission wavelength of light emitted from the indium-containing quantum wells.

2. The III-nitride film of claim 1, wherein the quantum well is sandwiched between at least a first barrier and a second barrier, and the first barrier and second barrier each have a thickness of 27.5 nm or greater.

3. The III-nitride film of claim 1, wherein the quantum well's thickness is 8 nm or greater.

4. The III-nitride film of claim 1, wherein the quantum wells comprise two or more quantum wells.

5. The III-nitride film of claim 1, wherein the film is grown on an m-plane gallium nitride (GaN).

6. The III-nitride film of claim 1, wherein the quantum wells are InGaN quantum wells and the barrier is a GaN barrier.

7. The III-nitride film of claim 1, wherein the barrier thickness is selected to obtain light emission from the quantum wells with a peak wavelength longer than 475 nm, and the light emission results from electron-hole pair recombination between an electron in a quantum well state in a conduction band of the III-nitride film and a hole in quantum well state in a valence band of the III-nitride film.

8. A device fabricated using the III-nitride film of claim 1.

9. The device of claim 8, wherein the III-nitride film is an active layer of a light emitting device.

10. The III-nitride film of claim 1, wherein the quantum wells are nonpolar.

11. The III-nitride film of claim 10, wherein
the quantum wells emit light, having a peak wavelength, in response to a range of injection currents passing through the film; and
the quantum wells have a nonpolar orientation, such that interfaces between the quantum wells and the barrier thickness, and between the quantum wells, are nonpolar planes, wherein the nonpolar planes and an alloy composition of an active layer are selected to reduce a polarization of the film or quantum wells, so that the peak wavelength remains substantially constant for the range of injection currents, thereby defining a degree of nonpolarity of the quantum wells or the film.

12. The III-nitride film of claim 11, wherein the range of injection currents produces a range of intensities of the emitted light, and a maximum intensity is at least 37 times a minimum intensity.

13. A method of fabricating a Group-III nitride film, comprising growing one or more indium-containing quantum wells with a barrier thickness of 27.5 nm or greater, wherein increasing the barrier thickness increases an emission wavelength of light emitted from the indium-containing quantum wells.

14. A method of emitting light from a Group-III nitride film, comprising emitting the light from one or more indium-containing quantum wells with a barrier thickness of 27.5 nm or greater, wherein increasing the barrier thickness increases an emission wavelength of light emitted from the indium-containing quantum wells.

15. The III-nitride film of claim 1, wherein an emission wavelength of light emitted from the indium-containing quantum wells is controlled by selecting the barrier thickness.

16. The method of claim 13, wherein an emission wavelength of light emitted from the indium-containing quantum wells is controlled by selecting the barrier thickness.

17. The method of claim 14, wherein an emission wavelength of light emitted from the indium-containing quantum wells is controlled by selecting the barrier thickness.

18. The method of claim 13, wherein the quantum well is sandwiched between at least a first barrier and a second barrier, and the first barrier and second barrier each have a thickness of 27.5 nm or greater.

19. The method of claim 13, wherein the quantum well's thickness is 8 nm or greater.

20. The method of claim 13, wherein the quantum wells comprise two or more quantum wells.

21. The method of claim 13, wherein the film is grown on an m-plane gallium nitride (GaN).

22. The method of claim 13, wherein the quantum wells are InGaN quantum wells and the barrier is a GaN barrier.

23. The method of claim 13, wherein the barrier thickness is selected to obtain light emission from the quantum wells with a peak wavelength longer than 475 nm, and the light emission results from electron-hole pair recombination between an electron in a quantum well state in a conduction band of the III-nitride film and a hole in quantum well state in a valence band of the III-nitride film.

24. A device fabricated using the method of claim 13.

25. The method of claim 13, wherein the quantum wells are nonpolar.

26. The method of claim 25, wherein
the quantum wells emit light, having a peak wavelength, in response to a range of injection currents passing through the film; and
the quantum wells have a nonpolar orientation, such that interfaces between the quantum wells and the barrier thickness, and between the quantum wells, are nonpolar planes, wherein the nonpolar planes and an alloy composition of an active layer are selected to reduce a polarization of the film or quantum wells, so that the peak wavelength remains substantially constant for the range of injection currents, thereby defining a degree of nonpolarity of the quantum wells or the film.

27. The method of claim 26, wherein the range of injection currents produces a range of intensities of the emitted light, and a maximum intensity is at least 37 times a minimum intensity.

* * * * *